United States Patent
Sato et al.

(10) Patent No.: US 6,610,448 B2
(45) Date of Patent: Aug. 26, 2003

(54) ALIGNMENT METHOD, OVERLAY DEVIATION INSPECTION METHOD AND PHOTOMASK

(75) Inventors: Takashi Sato, Fujisawa (JP); Soichi Inoue, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/874,958

(22) Filed: Jun. 7, 2001

(65) Prior Publication Data

US 2001/0055720 A1 Dec. 27, 2001

(30) Foreign Application Priority Data

Jun. 8, 2000 (JP) .......................................... 2000-172077

(51) Int. Cl.⁷ .................................................. G03F 9/00
(52) U.S. Cl. ................................ 430/5; 430/22; 430/30
(58) Field of Search ................................ 430/22, 30, 5

(56) References Cited

U.S. PATENT DOCUMENTS 4,475,811 A     10/1984  Brunner
5,702,567 A     12/1997  Mitsui et al.
5,989,759 A  *  11/1999  Ando et al. ................... 430/30

FOREIGN PATENT DOCUMENTS

JP      9-102457     4/1997
TW      361055       6/1999

* cited by examiner

*Primary Examiner*—Christopher G. Young
(74) *Attorney, Agent, or Firm*—Finnegan, Henderson, Farabow, Garrett & Dunner, L.L.P.

(57) ABSTRACT

When an alignment mark and first and second overlay deviation inspection marks as well as a device pattern are successively formed on a wafer using a first photomask and a second photomask, each of the alignment mark and the overlay deviation inspection marks are formed to have a part of the device pattern or marks having sizes and shapes similar to those of the device pattern, whereby these marks receive a deviation error caused by the influence given by the aberration of the light projection optical lens used for performing the pattern transfer and an error in the following processing steps in substantially the same degree as the device pattern, and an amount of the overlay deviation error is measured correctly so as to achieve an alignment of the photomasks in a high accuracy.

15 Claims, 8 Drawing Sheets

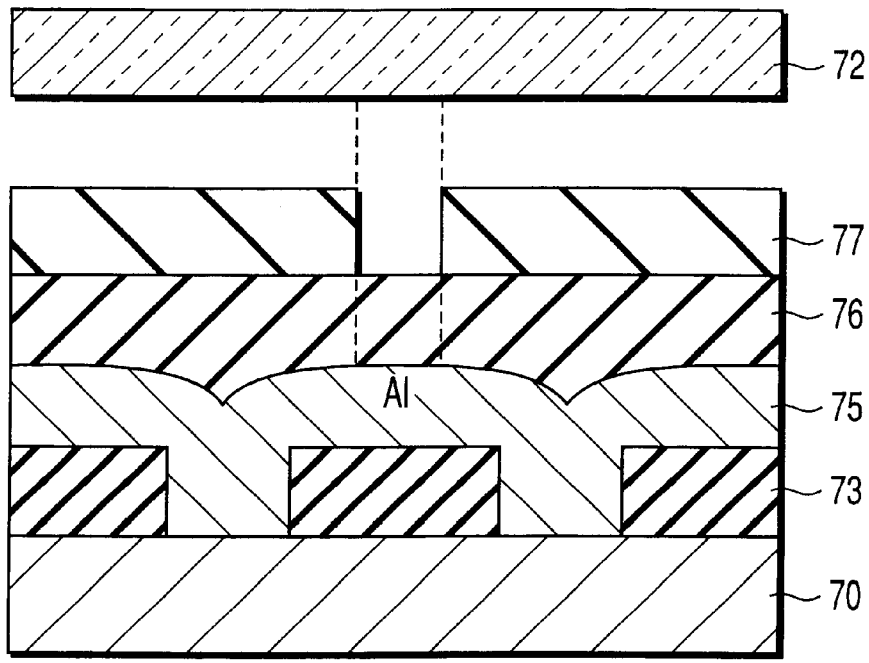
F I G. 6D
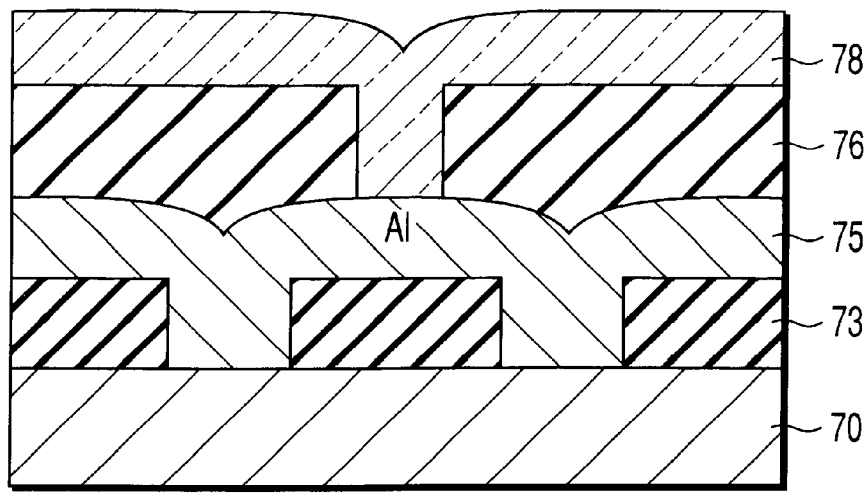
F I G. 6E

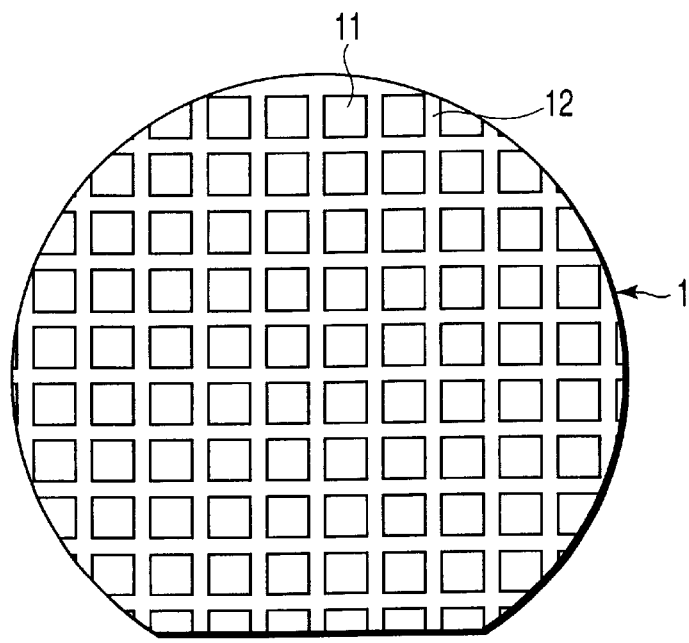
F I G. 7
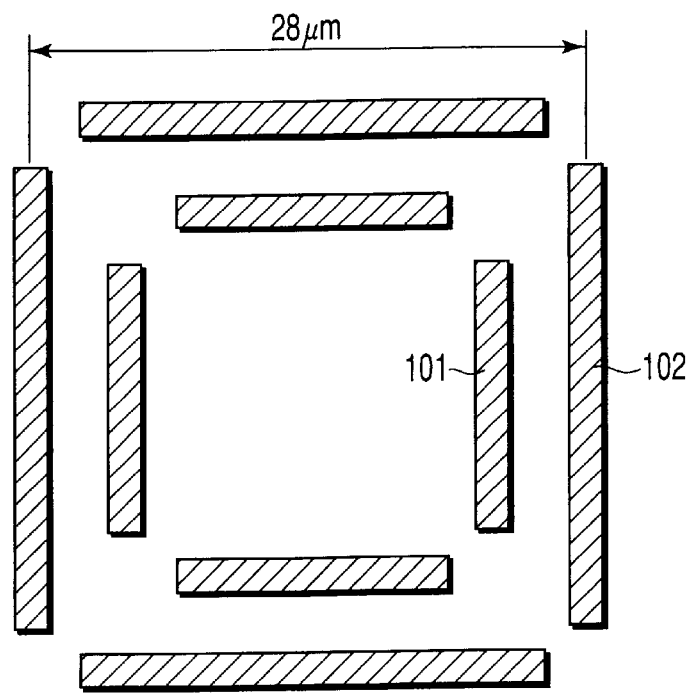
F I G. 8

ALIGNMENT METHOD, OVERLAY DEVIATION INSPECTION METHOD AND PHOTOMASK

CROSS-REFERENCE TO RELATED APPLICATIONS

This application is based on and claims the benefit of priority from the prior Japanese Patent Application No. 2000-172077, filed Jun. 8, 2000, the entire contents of which are incorporated herein by reference.

BACKGROUND OF THE INVENTION

The present invention relates to an alignment method for precisely overlaying photomasks used in lithography steps performed in manufacturing of semiconductor devices, a pattern-overlay inspection method, and a photomask used in these methods.

In the conventional method of manufacturing a semiconductor device, a semiconductor wafer is exposed to lights having mask patterns exceeding 20 patterns to overlay the mask patterns successively on the semiconductor wafer for forming finally a plurality of device patterns on the semiconductor wafer. When the pattern exposure is performed, the positioning of a photomask in an exposure apparatus is performed according to an alignment mark formed in advance on the photomask. After the positioning is fixed, the pattern exposure is performed to form a resist pattern on a chip of the semiconductor wafer for correctly overlaying the resist pattern on a pattern formed in advance within the chip.

The pattern-overlay inspection is then performed on the basis of the resist pattern and the pattern formed in advance on the chip so as to inspect whether a device pattern to be formed is correctly overlaid on the device pattern formed in advance on the chip.

It was customary in the past to inspect the overlay deviation of the alignment by forming inspection marks with given sizes and shapes for inspecting the overlay deviation of the alignment on first and second layers of wires, for example, on a silicon wafer. Then the formed marks are used in the measuring step for obtaining the deviation amount of the relative positions of the overlay inspection marks with an inspecting apparatus. In this case, since the inspection marks for inspecting the overlay deviation of the alignment were designed to have a size and shape that could be easily recognized by the inspecting apparatus, it was customary in the past to use the particular mark differing from the device pattern in size and shape.

FIG. 8 is a plan view showing typical conventional inspection marks for inspecting the deviation of alignment formed on the wafer together with a device pattern. The inspection marks include inner four marks 101 and outer four marks 102. The outer marks 102 are arranged to have a pitch of 28 μm as shown in the figure. Therefore, each of the outer marks 102 has a length slightly shorter than 28 μm.

The inspection marks 101 are formed in advance in the first layer of wires on the wafer, for example, and the inspection marks 102 are then formed on a second layer of wires on the first layer of wires to have an arrangement as shown in FIG. 8. The deviation of alignment can be inspected by obtaining a subtraction of a measured distance between the neighboring marks 101 and 102 and a reference distance, for example.

However, with progress in miniaturization of the device pattern achieved in recent years, a difficulty has arisen that, in the case where an inspection mark for inspecting the deviation of alignment and a device pattern are formed simultaneously, it is substantially impossible to form both the inspection mark and the device pattern with substantially the same degree of accuracy.

The difficulty is derived from the situation that the inspection marks for inspecting the deviation of alignment and the device pattern are not similar or equal to each other in size and shape. To be more specific, an error in the pattern position, size and shape takes place due to the aberration and focus position of the projection optical system including a projection lens in the exposure apparatus used in the lithography. In addition, the degree of the error varies depending on the shape, size and local density of the inspection marks and those of the device patterns.

It should also be noted that the working processes such as the etching and CMP (Chemical Mechanical Polishing) processes are likely to affect the degree of the error by the difference in the pattern shape and the difference in the local density of the patterns. FIG. 9 exemplifies a device pattern formed on the wafer together with the overlay deviation inspection marks shown in FIG. 8, for example. As shown in FIG. 9, the pitch of the device pattern is 0.35 μm. Thus, the device pattern shown in FIG. 9 is utterly different from the inspection marks shown in FIG. 8 in shape and size.

Also, the device pattern includes in some cases patterns differing from each other in the shape, size, density, etc. even if these patterns are formed on the same layer of wires on the wafer. In such a case, a difference in the error amount in respect of the pattern position and shape takes place depending on the difference in the pattern size and shape. In order to form a precise pattern, it is desirable to measure the errors in the position, shape and size of all the device patterns. However, such a measuring means has not been developed in the past.

The similar problems are also generated in the alignment mark used for finding the alignment position of the photomask in the light exposure step performed by using the exposure apparatus as well as in the inspection mark for measuring the deviation of alignment. In the case of using a mark that does not resemble the device pattern as the alignment mark, a difficulty is generated that it is difficult to recognize correctly the actual device pattern position on the wafer exposed to the light.

FIG. 10 is a plan view showing the conventional alignment mark formed on a wafer. The conventional alignment mark has a pattern having a pitch of 12 μm larger than that of the device pattern shown in FIG. 9 and is shaped like an oblong band, which widely differs from the device pattern shown in FIG. 9 in shape, size, etc.

Jpn. Pat. Appln. KOKAI No. 9-102457 discloses a means for solving the problem of an error generated from the situation that the alignment mark differs from the device pattern in shape and size. It is disclosed that the length of the alignment mark is divided into a length close to that of the device pattern. However, since the mark for inspecting the deviation of alignment and the alignment mark are designed separately from each other in the past, the inspecting mark and the alignment mark widely differ from each other in, for example, the pitch as apparent from FIGS. 8 and 10, resulting in failure to permit these inspecting mark and the alignment mark to be related to each other in the pattern size and shape.

This implies that the degree of the error in the pattern position taking place in the lithography and the subsequent working steps differs depending on the mark. As a result, it was difficult to measure accurately where and in what shape the device pattern formed on the basis of the alignment mark was formed so as to cause generation of the device pattern error.

As described above, the alignment mark, the mark for inspecting the deviation of alignment, and the device pattern differ from each other in the constituents of the pattern such as the pattern shape, size and density, with the result that the degrees of errors taking place in the pattern forming step differ from each other. For example, in forming a multi-layer structure by successively overlaying a first layer of wires, a second layer or wires, etc. on the wafer, it is difficult to overlay these layers of wires one upon the other with a high accuracy, thereby giving rise to a serious problem to be solved for manufacturing a semiconductor device of a multi-layer structure.

An object of the present invention is to provide an alignment method, a high accuracy overlay inspection method and a photomask used in these methods, in which both the alignment mark and the device pattern are formed so as to be affected in substantially the same degree by the error caused by the aberration of the projection optical system of the light exposure device used in exposing the pattern to the exposure light and by the error in the processing.

As a result, the amount of the positional deviation of the device pattern is rendered substantially equal to the amount of the positional deviation of the alignment mark and the mark for inspecting the overlay of photomasks.

According to the present invention, an alignment method that is expected to achieve the alignment with a high accuracy, an inspecting method of overlay of device patterns in a high accuracy, and a photomask used for these methods.

BRIEF SUMMARY OF THE INVENTION

The present invention is featured in that, where a first photomask and a second photomask are used in the lithography step employed in the manufacturing process of a semiconductor device, the mark for inspecting the deviation of the alignment of the mask and the alignment mark are constructed to include at least a part of the device pattern included in these masks when the first or second photomask is used for the light exposure. Since each of the alignment mark and the mark for inspecting the overlay of device pattern includes a mark equal or similar to those of the device pattern in size and shape in the corresponding photomask, the error caused by the aberration of the projection optical system used in the pattern exposure step and the error in the processing are received in substantially the same amount. As a result, the amounts of the positional deviation of these marks and patterns are substantially the same so as to make it possible to expect an alignment of a high accuracy.

The present invention is also featured in that, where a first photomask and a second photomask are used in the lithography step included in the manufacturing process of a semiconductor device, marks capable of measuring the relative deviation amount taking place among different patterns in size and shape are formed in the first photomask as the marks for the overlay inspection of the device patterns. The marks capable of measuring the relative deviation amount among the different patterns include a reference pattern having a relatively small deviation with respect to that of the device pattern shape and a mark having a relatively large deviation with respect to the device pattern shape.

The second photomask has also overlay inspection marks capable of measuring the amount of the relative deviation among different patterns, the relative deviation taking place when the second photomask is used for the light exposure. The marks include a reference mark having a relatively small deviation with respect to that of the device pattern shape and a mark having a relatively large deviation with respect to the device pattern shape, in the same manner as the first photomask.

Since the amounts of the positional deviation of the first photomask and the second photomask, the positional deviation being caused by the aberration of the projection optical system of the device pattern, are measured, and the result of the measurement is used for correcting the position in performing the light exposure by using the first photomask and the second photomask which are overlaid one upon the other, it is possible to expect the alignment of a high accuracy.

Further, the present invention is featured in that, where a first photomask and a second photomask are used in the lithography step included in the manufacturing process of a semiconductor device, the reference patterns of the first and second masks are the patterns receiving substantially the same error even if there is an error in the aberration of the projection optical system. When the light exposure is performed by overlaying the second photomask on the pattern formed by the first photomask, the overlay is corrected in view of the error in the relative positional deviation of the device shape relative to the reference pattern of the first photomask and in view of the similar error of the second photomask, making it possible to obtain a desired overlaying accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A to 6E are cross sectional views collectively showing sequentially steps of a manufacturing method of a semiconductor device by employing the alignment method of the present invention;

FIG. 7 is a plan view showing a wafer using the alignment method of the present invention;

FIG. 8 is a plan view showing a conventional mark for inspecting the deviation of alignment;

DETAILED DESCRIPTION OF THE INVENTION

Embodiments of the present invention will now be described with reference to the accompanying drawings. In the present invention, where the light exposure is performed by using a first photomask and a second photomask in the lithography step included in the manufacturing process of a semiconductor device, the mark for inspecting the deviation of overlay and the alignment mark included in each of these photomasks are constructed to include at least a part of the device pattern shape included in the mask.

Figure 1A:
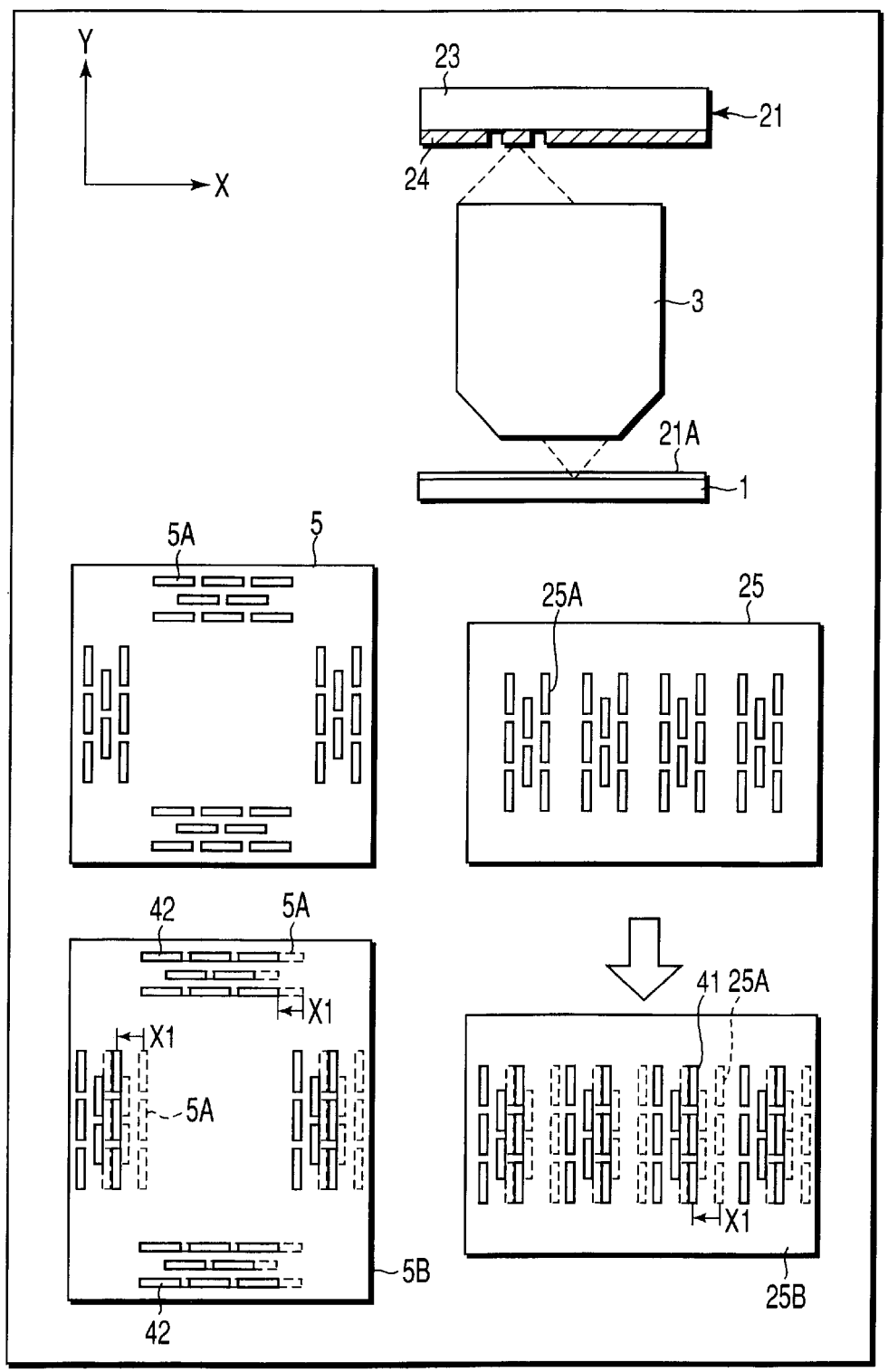
FIGS. 1A to 1C are plan views collectively showing an alignment mark and a mark for inspecting the deviation of pattern overlay, which are formed in the light exposure step performed by using first and second photomasks by the method of the present invention, and a chip formed by using these alignment mark and inspecting mark as well as the procedure of the light exposure treatment.

A first embodiment of the present invention will now be described with reference to FIGS. 1A to 1C. Specifically, FIGS. 1A to 1C schematically show the state that, when a device pattern portion 4 of FIG. 1B is formed on a chip 11 by exposing a wafer 1 to light by using first and second photomasks, an alignment mark and an inspecting mark are formed simultaneously, and that these marks and the device pattern are formed on the chip 11 in positions deviated by predetermined amounts from an ideal positions.

Figure 1B:
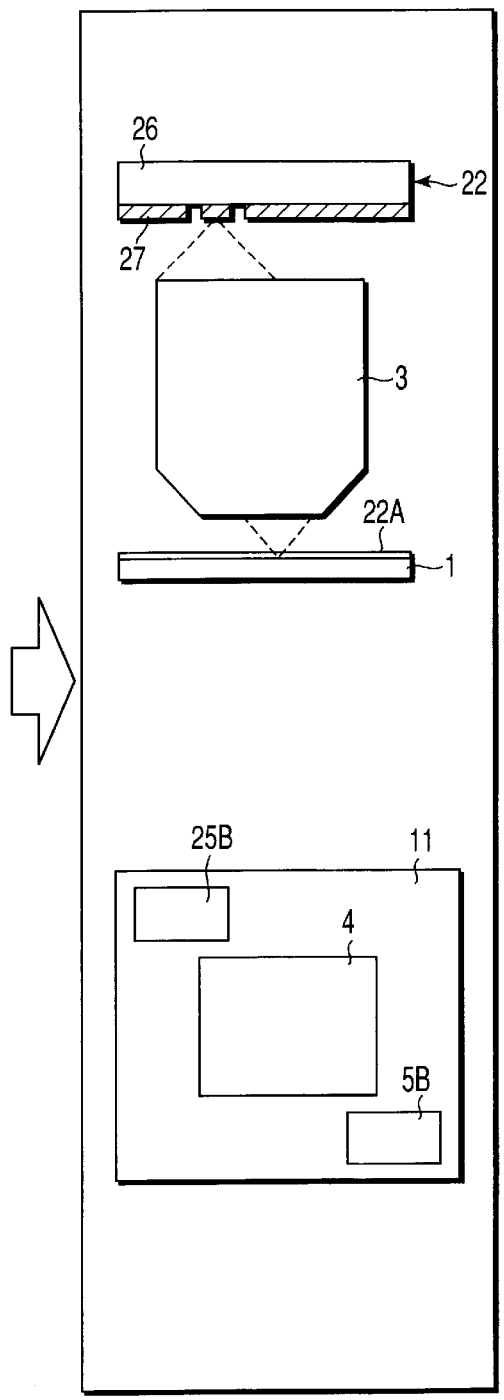
Figure 1C:
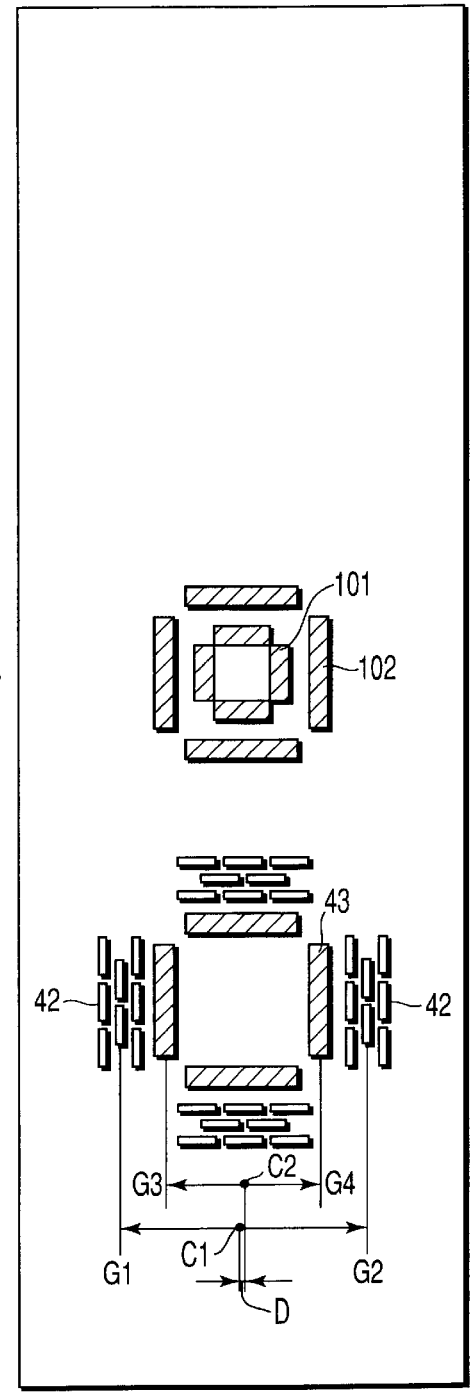

In the first step, the device pattern portion 4 is formed by using a first photomask 21 in a predetermined position on each of a plurality of chips 11 formed on the wafer 1 shown in, for example, FIG. 7, e.g., in the position shown in FIG. 1B together with an alignment mark portion 25B and a mark portion 5B for inspecting the deviation of overlay.

Concerning the alignment mark portion 25B, a mask pattern 25A consisting of a mask substrate 23 of a glass plate and a light shielding film 24 of a predetermined pattern formed on the mask substrate 23 is formed on the photomask 21, as shown in FIG. 1A.

Light emitted from a light source (not shown) is incident on the first photomask 21 from the upper surface of the mask substrate 23 and passes through the light shielding film 24 so as to form a patterned light of the alignment mark. The patterned light is converged by a projection lens 3 so as to be projected as an alignment mark 41 within the alignment mark portion 25B on a resist film 21A formed on the wafer 1.

As described herein later, if an ideal pattern forming position, when the positional deviation amount of the mask pattern 25A is zero, is denoted by broken lines, the alignment mark 41 exposed to light is deviated in the X-direction in an amount of X1. To be more specific, if the resist 21A on the wafer 1 is exposed to light by using the first photomask 21, the alignment mark 25A within the alignment mark portion 25B on the first photomask 21 is affected by, for example, the aberration of the projection lens 3, with the result that the alignment mark 25A is formed as a transferred alignment mark 41 in a position deviated from the desired position in an amount of X1 as shown by the solid line in FIG. 1A.

It follows that, if the alignment mark 41 is formed on the wafer 1 by using a resist mask formed by developing the resist 21A that was exposed to light, the alignment mark 41 is formed in a position deviated from the position of the alignment mark 25A on the photomask 21 in an amount of X1.

Concerning the overlay inspecting mark formed in the mark portion 5B on the chip 11 for inspecting the deviation of the overlay of the device pattern, the resist 21A is exposed to light by using an inspecting mark 5A within the inspecting mark portion 5B formed on the first photomask 21, as shown in the left portion of FIG. 1A. Like the alignment mark 25A, the inspecting mark 5A is also affected by, for example, the aberration of the projection lens 3, with the result that the inspecting mark 5A is formed as a mark portion 42 for inspecting the deviation of the transfer alignment in a position deviated from the ideal position denoted by broken lines in an amount of X1.

To be more specific, if the mark 42 for inspecting the deviation of overlay is formed on the chip 11 by using the resist mask formed by developing the resist 21A that is exposed to light, the inspecting mark 42 is formed as the mark portion 41 for inspecting the deviation in a position deviated in an amount of X1 from the ideal mark 5A formed on the photomask 21 for inspecting the deviation of overlay, as shown in FIG. 1A. Therefore, the relative positions between the alignment mark 41 or the overlay inspection mark 42 and the device pattern on the chip 11 are similar to those on the photomask 21.

Incidentally, the positional deviation in the X-direction alone is shown in FIG. 1A. However, the positional deviation caused by, for example, the aberration of the projection lens 3 takes place not only in the X-direction but also in the Y-direction. The positional deviation in the X-direction alone is described herein. Needless to say, however, it is necessary to inspect the amount of the positional deviation and to correct the deviation in the Y-direction, too. Since the position deviation in the Y-direction can be corrected as in the correction of the positional deviation in the X-direction, description is omitted herein in respect of the correction of the positional deviation in the Y-direction.

In the next step, a resist 22A newly formed on the wafer 1 by using a second photomask 22 formed of a glass substrate 26 and a light shielding film 27 formed on the substrate 26 is exposed to light, as shown in FIG. 1B. Formed on the second photomask 22 are a mark for inspecting the deviation of overlay together with the device pattern. An alignment mark is not formed on the second photomask 22.

The mark for inspecting the deviation of alignment formed on the second photomask 22 is a mark 43 for inspecting the deviation of alignment formed inside the mark 42, as shown in FIG. 1C, unlike the mark 42 for inspecting the deviation of alignment, which is formed on the chip 11 by using the mask mark 5A for inspecting the deviation of alignment, which is formed on the first photomask 21.

The mark 43 differs in size and shape from those of the mark 42 so as to distinguish easily these marks 42 and 43. Also, the mark 43 for inspecting the deviation of alignment is formed on the wafer at a position different from that of the mark 42. In this embodiment, the mark 43 is formed inside the mark 42. However, the mark 43 may be formed outside the mark 42.

The exposure position of the second photomask 22 is adjusted in conformity with the alignment mark 41 within the alignment mark portion 25B within the chip 11 on the wafer 1 in the step of exposing the resist film 22A to light by using a light exposure apparatus. Therefore, the second photomask 22 does not require a mask pattern for the alignment mark. However, when another alignment mark is required for alignment a third photomask, for example, this another alignment mark may be formed on the chip 11 aligned to the alignment mark formed on the chip 11 using the second photomask 22.

The mark 43 for inspecting the deviation of alignment, which is transferred to the chip 11 on the wafer 1 by using the second photomask 22, is transferred inside the mark 42 for inspecting the deviation of alignment, which is transferred by using the first photomask 21.

Each of the alignment mark 25A of the first photomask and the mark 5A for inspecting the deviation of alignment uses at least a part of the device pattern of the first photomask 21 as it is, or use a pattern equal to or similar to the device pattern. Also, the mark 43 for inspecting the deviation of alignment of the second photomask 22 is substantially equal in size and shape to the device pattern (not shown) of the second photomask 22.

Therefore, as in the case of the first photomask 21, the device pattern and the overlay inspection mark 43 formed on the chip 11 using the second photomask 22 are affected in the similar degree by the aberration and focus position of the projection lens 3 and the deviation of the device pattern is similar to the overlay inspection mark 43.

However, the deviation of the device pattern and the marks of the first photomask 21 formed on the chip 11 and the deviation of the device pattern and the marks of the second photomask 22 formed on the chip 11 are not the same, because the sizes and shapes of the first and second photomasks are not the same and because the deviation is also affected by the mechanical errors of the exposure apparatus and a change in the exposure conditions when the first and second photomasks are used in the same exposure apparatus.

For example, by setting the overlay inspection mark 43 to be formed at a center potion of the overlay mark 42, when the device patters of the first and second photomasks 21 and 22 have the similar sizes and shapes, the deviation amount of the mark 43 from the center of the mark 42 will show the difference of the deviation of the marks caused by the difference of the sizes and shapes of the device patterns on the first and second photomasks 21 and 22, as shown in FIG. 1C.

In the first embodiment, the deviation of alignment between the result of light exposure of the first photomask 21 and the result of light exposure of the second photomask 22 is measured by using a mark for measuring the deviation of alignment consisting of the first mark 42 for inspecting the deviation of alignment formed on the chip 11 and the mark 43 for inspecting the deviation of alignment formed on the resist 22A. Alternatively, the deviation of alignment noted above can be measured by forming each of the marks 42 and 43 on the chip 11.

For example, as shown in FIG. 1C, the difference D between the center C1 of the center points G1 and G2 in the outer overlay inspection marks 42 and the center C2 of the center points G3 and G4 in the inner overlay inspection marks 43 is measured. This measured difference D shows a deviation generated between the overlay inspection marks formed on the chip 11 by using the photomasks 21 and 22.

The mark 42 for inspecting the deviation of alignment is a mark formed by the light exposure of the first photomask 21 and has a shape equal to or similar to a part of the device pattern 4 included in the first photomask 21. On the other hand, the mark 43 for inspecting the deviation of alignment is a mark formed by the light exposure of the second photomask 22 and has a shape equal to or similar to a part of the device pattern (not shown) included in the second photomask 22. In FIG. 1C, the mark 43 for inspecting the deviation of overlay is shown in a large shape differing from the actual shape for the sake of convenience in the drawing. In general, however, the mark 43 is divided like the mark 42 for inspecting the deviation of alignment, though it is possible for the marks 42 and 43 to be slightly different from each other in the shape.

Incidentally, it is possible to transfer the conventional patterns 101 and 102 simultaneously by using the photomasks 21 and 22 for use in combination in the present invention, as shown in FIG. 1C. The mark consist of the mark 102 for inspecting the deviation of overlay, which is formed by using the first photomask 21, and the mark 101 for inspecting the deviation of overlay, which is formed by using the second photomask 22.

As described above, in the first embodiment of the present invention, each of the alignment mark 41 and the marks 42, 43 for inspecting the deviation of overlay includes a part or a similar pattern of the device pattern, with the result that these marks receive the error caused by the influence of the aberration of the projection optical system such as a projection lens used in performing the pattern transfer in substantially the same degree. This implies that, since the amounts of positional deviation are the same for each of these patterns and marks, it is possible to expect the mask alignment and device pattern overlay with a high accuracy in the following exposure steps.

A second embodiment of the present invention will now be described with reference to FIGS. 2A to 2D which collectively show schematically the alignment mark and the mark for inspecting the deviation of overlay, in a case in which are formed different patterns on the same photomask.

The second embodiment is featured in that, in the case where a first photomask and a second photomask are used in the lithography step included in the manufacturing process of a semiconductor device, and the light exposure is performed by using the first or second photomask, each of the mark for inspecting the deviation of overlay of the device patterns and the alignment mark includes at least a part of the device pattern shape included in the photomasks.

The first photomask includes first and second device patterns having different sizes and shapes and the second photomask includes a third device pattern of a size and shape different from those of the first and second device patterns. Therefore, the first and second photomasks include the overlay inspection mark and an alignment mark each having at least a part of these first to third device patterns.

In other words, each of the alignment mark and the mark for inspecting the deviation of overlay is formed by combining different patterns on the same photomask. The patterns are selected from the typical patterns within the device patterns included in the first and second photomasks.

In the second embodiment, a thick pattern and a fine pattern are selected from the device pattern in order to facilitate the description of the present invention. These thick pattern and fine pattern are alternately arranged in the patterns of the alignment mark and the mark for inspecting the deviation of overlay. The thick pattern and the fine pattern differ from each other in the amount of generation of the positional error when these patterns are transferred onto the wafer. It is possible to measure the positions of the thick pattern and the fine pattern by subjecting the generation amount of the positional error to a signal processing.

Figure 2A:
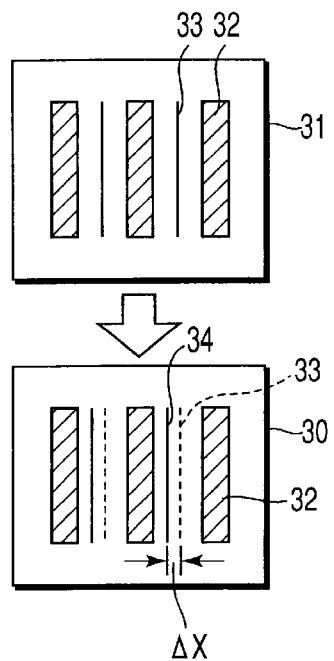
FIGS. 2A to 2D are plan views collectively showing various examples of alignment marks of the present invention formed by combination of different patterns on the same mask.

As shown in FIG. 2A, an alignment mark consisting of a thick pattern 32 and a thin pattern 33 alternately arranged is formed in a first photomask 31. The alignment mark is transferred onto a wafer 30 by using these thick pattern and fine pattern. The fine pattern 33 in a position that should originally be transferred is actually deviated in its position so as to actually allow a fine pattern 34 to be transferred in a deviated position. The rate of the positional deviation of the fine pattern 33 is larger than that of the thick pattern 32. Since the thick pattern 32 and the fine pattern 33 differ from each other in the amount of the positional error in X and Y directions when transferred onto the wafer, each of the position of the thick pattern 32 and the position of the fine pattern 33 is measured by a signal processing in view of the difference in the generation amount of the positional error noted above.

When an alignment mark is transferred onto the wafer 30 using the first photomask 31, the ideal position of the fine pattern 33 shown by the dotted lines is deviated at the position shown by the solid lines as the deviated fine pattern 34. The degree of the deviation of the fine pattern 34 is larger than that of the thick pattern 32. In this case, the deviation of the thick pattern 32 is assumed to be substantially zero.

However, in fact, the deviation of the thick pattern 32 is not zero and is deviated slightly in X and Y directions. Therefore, when a distance between the transferred thick pattern 32 and the transferred thin pattern 34 is measured, the measured distance will denote a sum of an original distance between the thick and thin patterns on the photomask 31 and a difference between the deviation of the thick pattern and the deviation of the thin pattern transferred on the wafer, or a relative deviation amount therebetween. Therefore, when the original distance is subtracted from the sum value, the resultant value will denote a relative deviation amount ΔX in the X direction. In this manner, the positional deviation amount ΔX due to the pattern difference of the device patterns can be determined on the alignment mark transferred on the wafer.

The relative deviation amount between alignment marks corresponding to the thick pattern 32d and thin pattern 33d which are included in the device pattern in the first photomask is measured by processing measured signals by taking the amount ΔX into consideration.

Figure 2B:
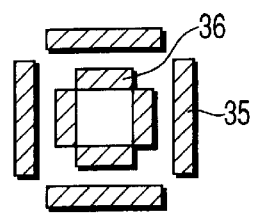
Figure 2C:
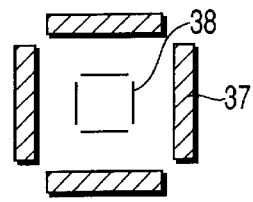
Figure 2D:
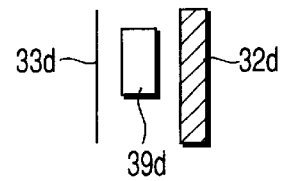

For example, as shown in FIG. 2D, a pattern 39d corresponding to a device pattern is transferred between the thick pattern 32 and the thin pattern 33 having an intermediate size between those of the thick and thin patterns 32 and 33 on the wafer using the second photomask. In this case, since the relative deviation amounts ΔX of the thick and thin patterns 32 and 33 are known, it is easy to align the second photomask so as to position the third pattern 39d at the center position between the thick and thin patterns 32 and 33.

FIGS. 2B and 2C show another case in which a third pattern 39d is first formed on the wafer using the first photomask and then the overlay inspection marks used to transfer the thick pattern 32d and thin pattern 33d are formed in such a manner that the third pattern 39d is positioned at the center of the thick and thin patterns 32d and 33d, as shown in FIG. 2D.

As shown in FIGS. 2B and 2C, the overlay inspection marks in the case where the device patterns have thick patterns, or the marks for inspecting the deviation of overlay for a large pattern comprising reference patterns 35 and 37 are formed on the wafer using the first photomask 31. In the same time, the third pattern 39d having the intermediate size is formed as shown in FIG. 2D.

In the next step, another thick pattern 36 is formed as the overlay inspection mark inside the thick patterns 35 by the second photomask. The third pattern 39d is designed to be formed at an intermediate position of the thick and thin patterns 32d and 33d as shown in FIG. 2D.

In the same time, inside the thick reference patterns 37 thin pattern 38 for the overlay inspection mark is formed using the second photomask as shown in FIG. 2C.

The mark for inspecting the deviation of alignment for a small pattern comprises a thick pattern 37 formed of the first photomask and a fine pattern 38 formed of the second photomask.

In this case, the overlay error in the case where the device pattern has a thick pattern can be measured using the overlay inspection marks 35 and 36 shown in FIG. 2B, and the overlay error in the case of thin device pattern can be measured using the overlay inspection marks 37 and 38 shown in FIG. 2C.

When an overlay inspection mark for the large pattern and an overlay inspection mark for the small pattern are prepared on the first and second photomasks, the overlay inspection for the respective device patterns can be performed. Therefore, as shown in FIG. 2D, it is easy to form the thick pattern 32d and the thin pattern 33d using the second photomask with respect to the device pattern 39d of the intermediate size using the first photomask at a correct position.

A third embodiment of the present invention will now be described with reference to FIGS. 3A to 3C. Specifically, FIGS. 3A to 3C collectively show schematically the marks for inspecting the deviation of alignment each formed on the photomask.

In the third embodiment, first and second sets of overlay inspection marks are formed using the first and second photomasks. The first set of overlay inspection marks are prepared for measuring a first error denoting mainly a mechanical error caused by the exposure apparatus, which does not include an error due to the aberration of the projection lens. The second set of overlay inspection marks are prepared for measuring a second error mainly caused by the exposure error due to the projection lens.

When an overlay exposure using a second photomask is performed on the pattern formed on the chip using a first photomask, the overlay of the second photomask is adjusted by taking the first and second errors into consideration, thereby achieving a desired accuracy of the pattern overlay.

Figure 3A:
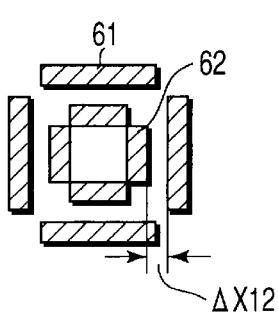
FIGS. 3A to 3C are plan views collectively exemplifying marks for inspecting the deviation of alignment, which are formed by the pattern transfer or pattern exposure of the present invention.
Figure 3B:
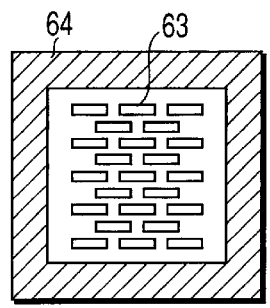
Figure 3C:
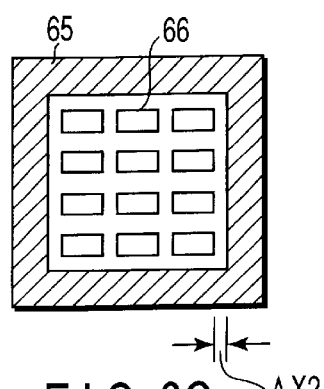

In this case, it is possible to use an alignment mark equal to that used in the first embodiment shown in FIG. 1A and the marks shown in FIGS. 3A to 3C as marks for inspecting the deviation of overlay in the case where the light exposure is performed by using the first photomask and the second photomask. The transferred patterns in the step of the light exposure performed by using the first photomask are the outside patterns 61 shown in FIG. 3A, a thick frame-like reference pattern 64 of a rectangular shape and the overlay inspection mark 63 having a device pattern as shown in FIG. 3B.

The patterns transferred in the light exposure step using the second photomask are an inside pattern 62 shown in FIG. 3A, a thick frame-like reference pattern 65 having a rectangular shape as shown in FIG. 3C, and the overlay inspection mark 66 having a device pattern as shown in FIG. 3C.

First, using the reference pattern 64 and the pattern 63 having the device pattern shape, a relative deviation amount ΔX1 caused by the exposure by using the first photomask is measured.

For example, the measured value ΔX1 can be obtained on the basis of the distance between a inside line of the reference pattern 64 in the X direction and the side of the pattern 63 in the X direction in FIG. 3B.

On the other hand, as shown in FIG. 3C, a reference pattern 65 and a pattern 66 having the device pattern shape in the second photomask are formed in the second photomask in the same manner as the patterns 63 and 64 formed in the first photomask. The positional deviation amount in the X direction between the two kinds of patterns such as the reference pattern 65 and the pattern 66 representing the device pattern is also measured in the second photomask. The measured deviation is denoted as ΔX as shown in FIG. 3C.

Further, the positional deviation amount between the first photomask and the second photomask measured by the conventional marks 61 and 62 is measured as ΔX12. The ΔX12 may be measured as a distance between a side line of the outside pattern 61 and a corresponding side line of the inside pattern 62 facing the outside pattern 61.

The positional deviation amount ΔX12D between the device pattern transferred by the first photomask and the device pattern transferred by the second photomask can be obtained from these three measured values by the formula given below:

$$\Delta X12D : \Delta X12 + \Delta X1 + \Delta X2$$

It is possible to obtain a high overlay accuracy by making the value of ΔX12D to be zero in the next light exposure step using the overlaid masks.

Also, in the third embodiment shown in FIGS. 3B and 3C, the four sides of the overlay inspection marks 63 and 66 having the device pattern shape is surrounded by the reference marks 64 and 65. However, the present invention is not limited to the particular construction. For example, it is possible to have only two sides in the X and Y directions of the overlay inspection mark 63 surrounded by the reference mark 64.

It is also possible to arrange the inspection marks with a reference pattern sandwiched therebetween. Further, it is possible to arrange the reference pattern simply within a measuring region in the vicinity of the device pattern.

Figure 4:
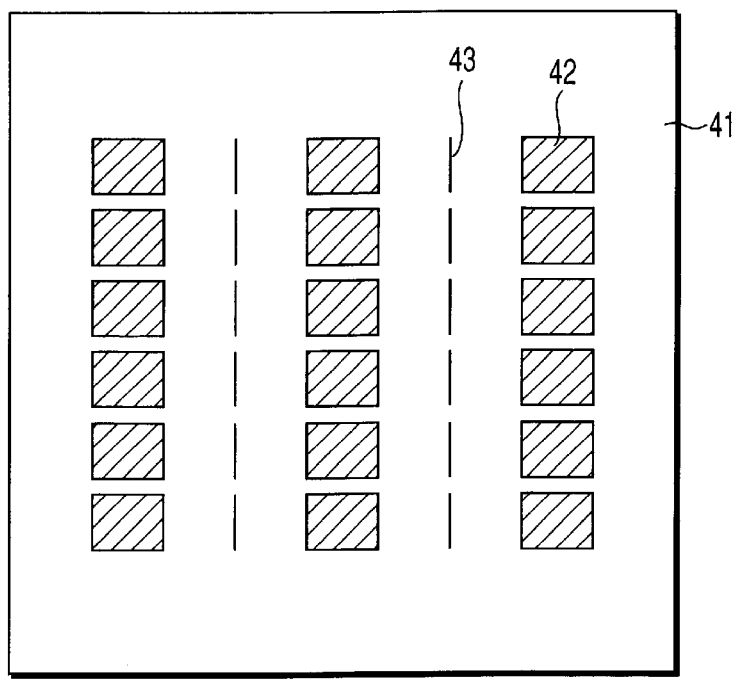
FIG. 4 is a plan view showing another example of the alignment mark of the present invention formed by combination of different patterns on the same photomask.

A fourth embodiment of the present invention will now be described with reference to FIGS. 4, 5A and 5B. FIG. 4 schematically shows an alignment mark formed by combination of different patterns on the same photomask. On the other hand, FIGS. 5A and 5B collectively show schematically a mark for inspecting the deviation of overlay formed by the combination of different patterns on the same photomask.

The fourth embodiment covers the case where a first photomask and a second photomask are used in the lithography steps included in the manufacturing process of a semiconductor device, and is featured in that, when the light exposure is performed by using the first or second photomask, a mark for inspecting the deviation of overlay of the photomask and an alignment mark are constructed to include at least a part of the device pattern included in the photomask, and that an alignment mark and a mark for inspecting the deviation of overlay are formed by the combination of different patterns on the same photomask.

However, in the case of using the alignment mark and the mark for inspecting the deviation of overlay as shown in, for examples, FIGS. 2A to 2C, the length in the longitudinal direction is rendered very large compared with the device pattern, even if the pattern size in the width direction corresponds to the device pattern. In such a case, there is a possibility of occurring an inconvenience that is not expected in the device pattern to take place in the process of consecutively executing these marks.

For example, a problem is generated in respect of the dependence of the dicing on the pattern in the CMP process, making it necessary to shorten the length of the mark. Under the circumstances, the alignment mark is divided for use as shown in FIG. 4. Also, the mark for inspecting the deviation of overlay is also divided as shown in FIGS. 5A and 5B. To be more specific, each of the fine patterns and the thick patterns is divided into a plurality of small patterns.

As shown in FIG. 4, an alignment mark consisting of a thick pattern 42 and a fine pattern 43 is formed on the first photomask 41. The alignment mark is transferred onto the wafer by using the particular alignment mark formed on the first photomask 41. The fine pattern in a position that should originally be transferred is actually deviated in its position so as to actually allow a fine pattern to be transferred in a deviated position. The rate of the positional deviation of the fine pattern is larger than that of the thick pattern. Since the thick pattern and the fine pattern differ from each other in the amount of the positional error when transferred onto the wafer, each of the position of the thick pattern and the position of the fine pattern is measured by a signal processing in view of the difference in the generation amount of the positional error noted above.

Figures 5A, 5B:
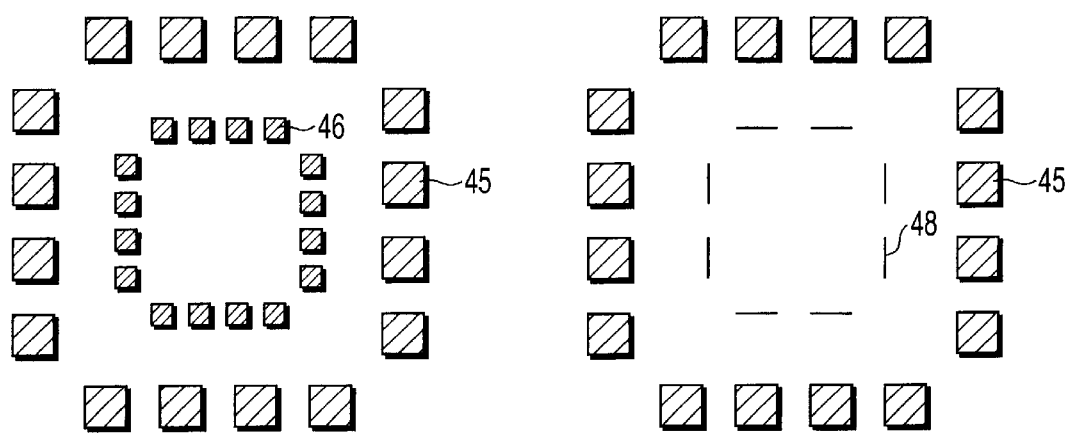
FIGS. 5A and 5B are plan views collectively showing other examples of the marks of the present invention for inspecting the deviation of alignment, which are formed by combination of different patterns on the same photomask.

Also, as shown in FIGS. 5A and 5B, when it comes to the mark for inspecting the deviation of alignment formed on the wafer, the mark for inspecting the deviation of overlay for a large pattern comprises a thick pattern 45 formed of the first photomask and another thick pattern 46 formed of the second photomask. On the other hand, the mark for inspecting the deviation of overlay for a small pattern comprises a thick pattern 47 formed of the first photomask and a fine pattern 48 formed of the second photomask.

If the marks for inspecting the deviation of overlay are prepared for the large pattern and the small pattern, respectively, as described above, it is possible to measure the deviation of alignment relative to each of these large and small patterns. The reference patterns 64 and 65 shown in FIGS. 3B and 3C can also be divided for use as in the third embodiment. With the particular construction, it is possible to measure the deviation of alignment for each of the patterns.

A fifth embodiment of the present invention will now be described with reference to FIGS. 6A to 6E, which are cross sectional views collectively showing the manufacturing process of a semiconductor device. Described in the following is manufacturing steps of a semiconductor device by employing the alignment method of the present invention.

Figure 6A:
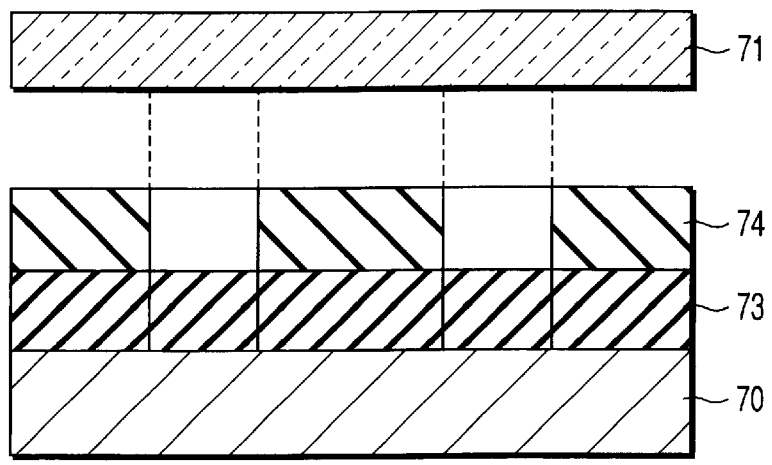

In the first step, a silicon oxide ($SiO_2$) film 73 is formed on a semiconductor substrate 70 such as a silicon semiconductor substrate, followed by forming a photoresist film 74 on the silicon oxide film 73, as shown in FIG. 6A. Further, the photoresist film 74 is selectively exposed to light by using a first photomask 71 described previously in conjunction with the first to fourth embodiments, followed by the developing treatment to form open portions.

Figure 6B:
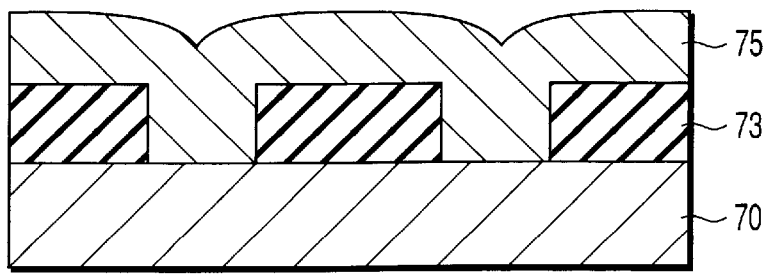

Then, the silicon oxide film 73 is etched with the photoresist 74 used as a mask so as to form contact holes in the silicon oxide film 73, followed by forming a first layer aluminum wiring 75 on the silicon oxide film 73, as shown in FIG. 6B. The first layer aluminum wiring 75 is electrically connected to the semiconductor substrate 70 via the contact holes.

Figure 6C:
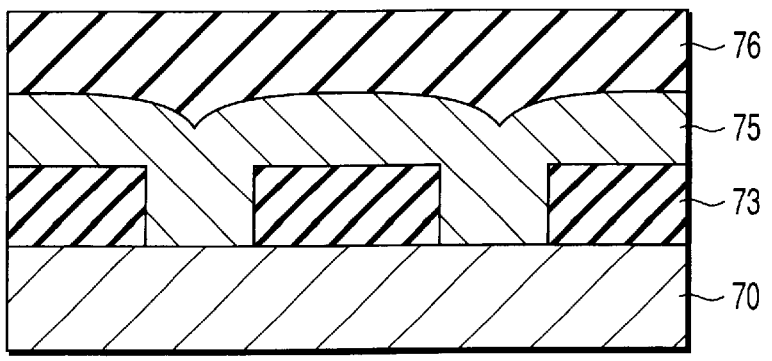
Figure 9:
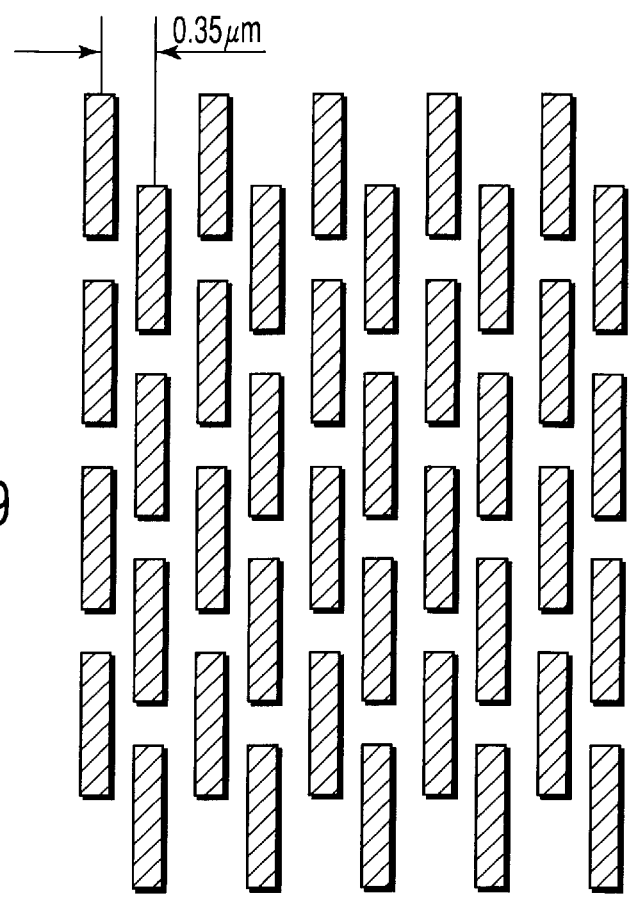
FIG. 9 is a plan view showing one example of a device pattern formed on a wafer.
Figure 10:
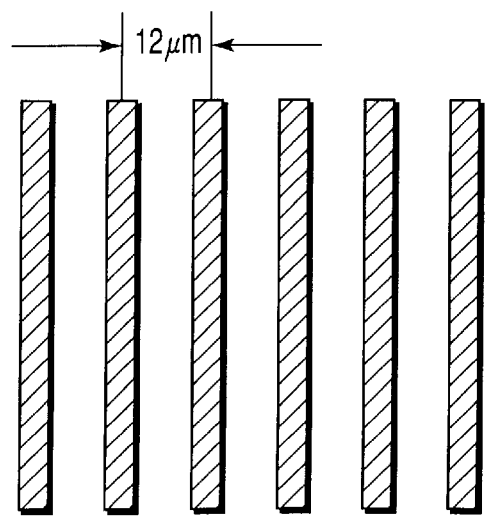
FIG. 10 is a plan view showing the conventional alignment mark.

In the next step, a silicon oxide (SiO$_2$) film 76 is formed in a manner to cover the upper surface of the first layer aluminum wiring 75, followed by planarizing the surface of the silicon oxide film 76 by CMP, as shown in FIG. 6C.

Then, a photoresist film 77 is formed on the silicon oxide film 76. The photoresist film 77 is then selectively exposed to light by using a second photomask 72 of the construction equal to that described previously in conjunction with the first to fourth embodiments so as to form an open portion, as shown in FIG. 6D. Then, the silicon oxide film 76 is etched with the photoresist film 77 used as a mask so as to form a contact hole in the silicon oxide film 76.

After removal of the photoresist film 77, a second layer aluminum wiring 78 is formed on the silicon oxide film 76, followed by patterning the second layer aluminum wiring 78. The second layer aluminum wiring 78 is electrically connected to the first layer aluminum wiring 75 via the contact hole, as shown in FIG. 6E.

In the manufacturing process described above, each of the first and second photomasks is constructed such that each of the alignment mark and the mark for inspecting the deviation of overlay includes a part of the device pattern or an equivalent pattern as in the first embodiment. It follows that the alignment mark and the mark for inspecting the deviation of overlay receive the error caused by the influence given by the aberration of the projection optical system including a projection lens used in performing the pattern transfer in substantially the same degree. As a result, the amount of the positional deviation of the pattern is the same, making it possible to achieve an alignment of a high accuracy, i.e., formation of the device pattern.

FIG. 7 schematically shows that a large number of chips 11 are formed on the wafer 1 such as a silicon wafer. The chips 11 are arranged on the wafer 1 to form a two dimensional array, and dicing lines 12 are formed between the adjacent chips 11. After the processing of the wafer 1, the wafer 1 is cut along the dicing lines 12 so as to obtain a plurality of the individual chips 11.

The alignment mark and the mark for inspecting the deviation of overlay referred to in each of the first to fourth embodiments of the present invention described above are constructed as follows:

(1) These marks can be formed on the dicing lines.
(2) These marks can be formed in positions close to the device pattern on each chip.
(3) The device pattern formed in a selected single chip can be used as an alignment mark and a mark for inspecting the deviation of overlay in the subsequent lithography step.

Since each of the alignment mark and the mark for inspecting the deviation of overlay includes a part of the device pattern or an equivalent pattern, these marks receive an error caused by the influence given by the aberration of the projection optical system used in performing the pattern transfer in substantially the same degree as the device pattern. This implies that the positional deviation amount of these patterns is the same, with the result that it is possible to expect an alignment of a high accuracy. It is also possible to perform the measurement with a high accuracy in measuring the error in the overlay. It should also be noted that, in the case of including a plurality of patterns differing from each other in the size and shape of the device pattern, it is possible to achieve an alignment of a high accuracy even if the positional deviation amount caused by, for example, the aberration of the projection optical system differs depending on the pattern.

What should also be noted is that it is possible to expect an alignment of a high accuracy by measuring the positional deviation amount of the device pattern of the first photomask and the second photomask, the deviation being caused by, for example, the aberration of the projection optical system, and by using the result of the measurement for the correction of the position in performing the light exposure by using the first photomask and second photomask which are overlaid one upon the other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An alignment method, comprising:

forming at least a first device pattern, a first deviation inspection mark and an alignment mark on a wafer, using a first photomask having the first device pattern, the first deviation inspection mark and the alignment mark, each of the first deviation inspection mark and the alignment mark having a shape equal to or similar to that of said first device pattern;

positioning a second photomask with respect to a photoresist film formed on said wafer according to said alignment mark formed on said wafer; and =P1 forming at least a second device pattern and a second deviation inspection mark on the photoresist film formed on the wafer, using the second photomask having the second device pattern and the second deviation inspection mark, the second deviation inspection mark having a shape equal to or similar to that of said second device pattern, wherein a deviation between the first device pattern formed on the wafer and the second device pattern formed on the photoresist film is inspected from the first and second deviation inspection marks.

2. An alignment method according to claim 1, further comprising:

forming the alignment mark and the first device pattern on the wafer by using the first photomask having the first device pattern including first and second device pattern elements with different sizes and shapes and the alignment mark including first and second alignment mark elements with sizes and shapes corresponding to those of the first and second device pattern elements; and positioning said second photomask with respect to said wafer according to positions of said first and second alignment mark elements of the alignment mark.

3. An alignment method according to claim 2, wherein said first alignment mark element has a size and a shape to cause an exposure position deviation amount due to an optical system of an exposure apparatus for exposing the resist film being smaller than that caused by said second alignment mark element.

4. An alignment method according to claim 1, wherein said first photomask has first and second deviation inspection reference marks having similar size and shape with each other; and said second photomask has a first inspection mark with a size and shape similar to said first deviation inspection reference mark, the first inspection mark being positioned on said wafer in association with said first deviation inspection reference mark, and has a second inspection mark causing an exposure deviation amount due to an optical system of an exposure apparatus used for exposing said photoresist film larger than that of said first inspection mark, the second inspection mark being positioned on said photoresist film in association with said second deviation inspection reference mark; and the alignment method further comprising:

correcting the exposure positions of the first and second photomasks using selectively one of a first arrangement or a second arrangement according to the size and shape of the second device pattern formed in said second photomask, the first arrangement being a combination of said first deviation inspection reference mark and said first inspection mark and the second arrangement being a combination of said second deviation inspection reference mark and said second inspection mark.

5. An alignment method according to claim 1, wherein said first photomask has the first deviation inspection mark, a first reference mark, and the second deviation inspection mark which has a size and a shape equal to or similar to said first device pattern, the second deviation inspection mark being deviated largely caused by the optical system of an exposure apparatus with respect to the first reference mark; and said second photomask has a second reference mark, a third deviation inspection mark which has a size and a shape equal to or similar to said second device pattern, the third deviation inspection mark being deviated largely caused by the optical system of the exposure apparatus with respect to the second reference pattern, and a fourth deviation inspection mark positioned in association with the first deviation inspection mark formed on said wafer; and the alignment method further comprising:

calculating a sum of a first deviation between said first and fourth deviation inspection marks, a second deviation between said first reference mark and said second deviation inspection mark, and a third deviation between said second reference mark and said third deviation inspection mark; and correcting an exposure position of another photomask using the calculated sum.

6. An overlay inspection method for a photomask, comprising:

forming on a wafer a first device pattern, a first deviation inspection mark and an alignment mark, using a first photomask having at least the first device pattern, the first deviation inspection mark and the alignment mark, the first deviation inspection mark and the alignment mark have a shape equal to or similar to the first device pattern;

positioning a second photomask on a resist film formed on the wafer with respect to the alignment mark on the wafer, said second photomask having a second device pattern and a second deviation inspection mark which has a shape equal to or similar to that of said second device pattern;

exposing said resist film formed on the wafer to the second photomask positioned according to the alignment mark to form on the resist film an exposure pattern of the second photomask including the second device pattern and the second deviation inspection mark; and determining the positioning accuracy of the second photomask with respect to the wafer using the first and second deviation inspection marks.

7. An overlay inspection method according to claim 6, further comprising:

forming, at a position on said resist film corresponding to said first deviation inspection mark, an exposure pattern of said second deviation inspection mark, together with said second device pattern.

8. An overlay inspection method according to claim 6, further comprising:

forming the alignment mark and the first device pattern on the wafer by using the first photomask having the first device pattern including first and second device pattern elements with different sizes and shapes and an alignment mark including first and second alignment mark elements with sizes and shapes corresponding to those of the first and second device pattern elements; and positioning said second photomask with respect to said resist film formed on the wafer according to positions of said first and second alignment mark elements of the alignment mark.

9. An overlay inspection method according to claim 8, wherein said first alignment mark element has a size and a shape to cause an exposure position deviation amount due to an optical system of an exposure apparatus for exposing the resist film being smaller than that caused by said second alignment mark element.

10. An overlay inspection method according to claim 6, said first photomask has first and second deviation inspection reference marks having similar size and shape with each other; and said second photomask has a first inspection mark with a size and shape similar to said first deviation inspection reference mark, the first inspection mark being positioned on said wafer in association with said first deviation inspection reference mark, and has a second inspection mark causing an exposure deviation amount due to an optical system of an exposure apparatus used for exposing said resist film larger than that of said first inspection mark, the second inspection mark being positioned on said resist film in association with said second deviation inspection reference mark; and the overlay inspection method further comprising:

correcting the exposure positions of the first and second photomasks using selectively one of a first arrangement or a second arrangement according to the size and shape of the second device pattern formed in said second photomask, the first arrangement being a combination of said first deviation inspection reference mark and said first inspection mark and the second arrangement being a combination of said second deviation inspection reference mark and said second inspection mark.

11. An overlay inspection method according to claim 6, wherein said first photomask has the first deviation inspection mark, a first reference mark, and the second deviation inspection mark which has a size and a shape equal to or similar to said first device pattern and is deviated largely caused by the optical system of an exposure apparatus with respect to the first reference pattern; and said second photomask has a second reference mark, a third deviation inspection mark which has a size and a shape equal to or similar to said second device pattern and is deviated largely caused by the optical system of the exposure apparatus with respect to the second reference pattern, and a fourth inspection mark positioned in association with the first deviation inspection mark formed on said wafer; and the overlay inspection method further comprising:

calculating a sum of a first deviation between said first and fourth deviation inspection marks, a second deviation between said first reference pattern and said second deviation inspection mark, and a third deviation between said second reference pattern and said third deviation inspection mark; and correcting an exposure position of another photomask using the calculated sum.

12. A photomask comprising:

a device pattern;

an alignment mark having a size and a shape equal to or similar to those of said device pattern; and an overlay deviation inspection mark having a size and a shape equal to or similar to those of said device pattern.

13. A photomask comprising:

a device pattern configuration including at least two device patterns having different sizes and shapes;

an alignment mark including at least two alignment mark elements having different sizes and shapes corresponding to those of the device patterns; and an overlay deviation inspection mark having a shape including a part of said device pattern configuration.

14. A photomask comprising:

a device pattern configuration;

an alignment mark including a reference pattern and a part of said device pattern configuration; and an overlay deviation inspection mark having a shape including a part of said device pattern configuration.

15. A photomask according to any one of claims 12 to 14, wherein said alignment mark and said overlay deviation inspection mark respectively have a width and a length corresponding to those of said device pattern configuration.

\* \* \* \* \*

UNITED STATES PATENT AND TRADEMARK OFFICE
CERTIFICATE OF CORRECTION

PATENT NO. : 6,610,448 B2
DATED : August 26, 2003
INVENTOR(S) : Sato et al.

It is certified that error appears in the above-identified patent and that said Letters Patent is hereby corrected as shown below:

<u>Column 14,</u>
Line 32, after "wafer; and" delete "=P1" and insert a paragraph break.

Signed and Sealed this

Ninth Day of March, 2004

JON W. DUDAS
*Acting Director of the United States Patent and Trademark Office*